United States Patent
Xu et al.

(10) Patent No.: US 11,898,422 B2
(45) Date of Patent: Feb. 13, 2024

(54) DIAMOND COATING ON THE CONE FOR EXPANDABLE TUBULARS

(71) Applicant: SAUDI ARABIAN OIL COMPANY, Dhahran (SA)

(72) Inventors: Jianhui Xu, Dhahran (SA); Guodong (David) Zhan, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 427 days.

(21) Appl. No.: 17/088,179

(22) Filed: Nov. 3, 2020

(65) Prior Publication Data

US 2022/0134410 A1    May 5, 2022

(51) Int. Cl.
*E21B 43/10* (2006.01)
*C23C 16/02* (2006.01)
*C23C 16/27* (2006.01)

(52) U.S. Cl.
CPC ........ *E21B 43/105* (2013.01); *C23C 16/0272* (2013.01); *C23C 16/27* (2013.01)

(58) Field of Classification Search
CPC ........ E21B 29/10; E21B 43/105; C23C 16/27
See application file for complete search history.

(56) References Cited

U.S. PATENT DOCUMENTS

| | | | |
|---|---|---|---|
| 4,424,648 A | 1/1984 | Largeteau | |
| 6,557,640 B1 | 5/2003 | Cook et al. | |
| 6,691,777 B2 | 2/2004 | Murray et al. | |
| 7,571,774 B2 | 8/2009 | Shuster et al. | |
| 8,602,113 B2 | 12/2013 | Jin et al. | |
| 8,640,768 B2 | 2/2014 | Hall et al. | |
| 10,316,627 B2 | 6/2019 | Brisco et al. | |
| 2003/0075339 A1* | 4/2003 | Gano | E21B 43/105 166/383 |
| 2003/0075340 A1 | 4/2003 | Tran et al. | |
| 2007/0205001 A1 | 9/2007 | Shuster et al. | |

(Continued)

FOREIGN PATENT DOCUMENTS

| CN | 102966323 A | 3/2013 |
|---|---|---|
| CN | 103742093 A | 4/2014 |

(Continued)

OTHER PUBLICATIONS

International Search Report and Written Opinion issued in corresponding PCT International Application No. PCT/US2021/057907 dated May 6, 2022 (17 pages).

(Continued)

*Primary Examiner* — Cathleen R Hutchins
(74) *Attorney, Agent, or Firm* — Osha Bergman Watanabe & Burton LLP

(57) ABSTRACT

An expansion cone useful for expanding an expandable tubular, the expansion cone includes: a base material selected from a group consisting of alloyed steel, tungsten carbide coated alloyed steel, and cemented tungsten carbide; an intermediate buffering layer; and a coating deposited on an outer surface of the intermediate buffering layer; wherein the intermediate buffering layer is deposited between an outer surface of the steel alloy base material and the coating, wherein the intermediate buffering layer is one or more selected from a group consisting of Silicon (Si), Titanium (Ti), and silicon carbide (SiC), and wherein the coating is a diamond containing coating.

8 Claims, 7 Drawing Sheets

(56) References Cited

U.S. PATENT DOCUMENTS

| | | | |
|---|---|---|---|
| 2007/0215360 A1 | 9/2007 | Shuster et al. | |
| 2014/0178637 A1* | 6/2014 | Rajagopalan | C23C 14/0605 |
| | | | 427/249.7 |
| 2015/0165507 A1 | 6/2015 | Reese | |
| 2015/0300095 A1* | 10/2015 | Chen | E21B 10/5735 |
| | | | 175/57 |

FOREIGN PATENT DOCUMENTS

| | | |
|---|---|---|
| CN | 103742094 A | 4/2014 |
| CN | 110295869 B | 7/2020 |
| GB | 2396641 A | 6/2004 |
| JP | 3900430 B2 | 4/2007 |
| JP | 6238063 B2 | 11/2017 |
| WO | 2003/064813 A1 | 8/2003 |
| WO | 2006/102171 A2 | 9/2006 |
| WO | 2010/145674 A1 | 12/2010 |

OTHER PUBLICATIONS

Zhan, Guodong David, et al. "New Ultra-Strong and Catalyst-Free PDC Cutting Element Technology", InInternational Petroleum Technology Conference. Jan. 13, 2020, pp. 1-12, [12 Pages].

"Fabrication and application of boron-doped diamond coated rectangular-hole shaped drawing dies", (CVD Diamond film on WC-Co), International Journal of Refractory Metals and Hard Materials, 41 (2013), p. 422-431 (10 pages).

"Friction properties of partially polished CVD diamond films at different sliding speeds". (COF of diamond film vs. stainless steel), Diamond & Related Materials, 24 (2012), p. 167-170 (4 pages).

"Formation of lubrication film of diamond-like carbon films in water and air environments against stainless steel and Cr-plated balls" (COF of DLC to stainless steel), Diamond and Related Materials, vol. 16, Issues 4-7, (2007) p. 1336-1339 (4 pages).

"Surface modification to improve friction and galling properties of forming tools" (DLC coating to dramatically reduce galling of stainless steel), Journal of Materials Processing Technology, vol. 174, Issues 1-3 (2006), p. 334-341 (8 pages).

"Influence of Surface Roughness and Coating Type on the Galling Properties of Coated Forming Tool Steel" (DLC coating on tool steel to reduce galling to the stainless steel), Surface and Coatings Technology, 184 (2004), p. 338-348 (11 pages).

* cited by examiner

DIAMOND COATING ON THE CONE FOR EXPANDABLE TUBULARS

BACKGROUND

Expandable tubular technologies are generally used in repairing damaged casing, blocking a water leak zone, blocking a lost circulation zone, increasing the casing internal diameter for faster production rate, saving the casing usage in the monobore casing design, and improving sand control efficiency due to the reduced annulus between an expanded screen and the bore hole.

To reduce the loss of the internal diameter each time a new casing string or liner is set, a cold working process has been developed whereby the casing or liner can be expanded by up to 20% in diameter after being run down-hole. For this purpose, an expansion cone that exceeds the inner diameter of the tube by the required amount of expansion is forced through the pipe. This is done either hydraulically, by applying mud pressure, or mechanically, by pulling the expansion cone. The expansion needs to be reliable, especially when expanding several thousand feet below the surface.

The main components in the expandable tubular system, as illustrated in FIG. 1, include the tubular 3 to be expanded, and the expansion cone 2 that is used to push the tubular, as explained above. During the expansion, the outer diameter of the cone 2 exerts a force to the internal diameter of the tubular 3. The tubular 3 is then expanded outward with permanent plastic deformation in a range determined by the geometries and the material properties of the tubular and the cone. As the expansion cone 2 moves through tubular 3, the unexpanded section 3a is worked upon by the cone, expanding the tubular to a larger inner diameter tubular section 3b.

During the interaction between the expansion cone and the expandable tubular, the friction force between the expansion cone and the expandable tubular can be high, especially along the transition section 3c, where the majority of the force is applied to the tubular. The friction force is determined by several factors, including materials, cone angle, surface roughness, lubrication, load level, etc. In some cases, the friction force is high enough to cause unfavorable rubbing damage on both the cone and tubular. In some other cases, galling happens between the expansion cone and the expandable tubular, especially in the application for expanding stainless steel tubulars, aluminium tubulars or nickel-based alloy tubulars. The galling, as a type of cold welding between the two components, can also cause damage to the cone and the tubular.

Therefore, to reduce the friction force and the galling tendency between the cone and the tubular, a coating between the expansion cone and the expandable tubular is necessary. Without a coating, the alloyed steel of the cone can have relatively high kinetic coefficients of friction against carbon steel or stainless steel of the tubular. When the stainless steel, aluminium alloy or nickel-based alloy is severely rubbed against the other steel component, the oxidation layer on the surface will be broken down and fresh steel substrate is exposed, which can be reactive to create the cold welding with the other steel component under high compression force.

To potentially reduce the friction force and the galling tendency between the cone and the tubular and increase the life of the expansion cone, the traditional expandable tubular technologies apply a tungsten carbide (WC) layer as a hard coating on the steel substrate of the expansion cone. In this case, under the Vickers hardness test, the hardness of the WC layer can range from Vickers Pyramid Number (HV) 850 to HV 1350, depending on the material, grain structure, and the application process.

However, in some cases, large WC particles in the hard coating can damage the internal surface of the expandable tubular. In some other cases, the WC layer is formed by the thermal spray of WC-based coating on the steel cone, in which the grain size of WC is only about several micron and the surface of the coating is polished to minimize the aggressiveness. The damage from the grains of WC on the cone to the expandable tubular is minimized, but the coating can still have a relatively high coefficient of friction. Therefore, the WC hard coating on the steel substrate of the expansion cone alone is not a favorable protection in the expandable tubular application.

Yet another method for reducing the friction caused by the contact between the expansion cone and the expandable tubular is improving the lubricity of drilling muds. In industry drilling operations, attempts have been made to reduce friction through, mainly, using water and/or oil based lubricants containing various types of expensive and often environmentally unfriendly additives. Diesel and/or mineral oils are also often used as lubricants, but there is a problem with the disposal of the lubricants. Certain minerals, such as bentonite, are known to help reduce friction between the drill stem assembly and materials, such as Teflon, have also been used to reduce friction. However, these materials also lack durability and strength. Other additives used include vegetable oils, asphalt, graphite, detergents and walnut hulls, but each has its own limitations.

SUMMARY OF THE CLAIMED EMBODIMENTS

In general, in one aspect, embodiments herein relate to an expansion cone useful for expanding an expandable tubular. The expansion cone includes a base material selected from a group consisting of alloyed steel, tungsten carbide coated alloyed steel, and cemented tungsten carbide; an intermediate buffering layer; and a coating deposited on an outer surface of the intermediate buffering layer. The intermediate buffering layer is deposited between an outer surface of the steel alloy base material and the coating, wherein the intermediate buffering layer is one or more selected from a group consisting of Silicon (Si), Titanium (Ti), and silicon carbide (SiC). The coating is a diamond containing coating.

In general, in one aspect, the embodiments herein relate to an expansion cone useful for expanding an expandable tubular. The expansion cone includes a base material having an upper cylindrical section, a lower cylindrical section, and a tapered section therebetween; a plurality of pockets formed in at least the tapered section of the steel alloy base material; a plurality of inserts disposed within the plurality of pockets. The plurality of inserts include an outer surface layer or coating selected from a group consisting of nanocrystalline diamond, amorphous diamond, a diamond-like carbon, and mixtures thereof.

In general, in one aspect, the embodiments herein relate to a method for forming an expansion cone useful for expanding an expandable tubular. The method includes forming a base expansion cone having an upper cylindrical section, a lower cylindrical section, and a tapered section therebetween; forming a plurality of pockets within the base expansion cone tapered section; disposing a plurality of inserts within the plurality of pockets. The plurality of inserts are selected from a group consisting of unleached diamond-cobalt compacts, leached diamond-cobalt compacts, diamond-silicon compacts, binderless diamond compacts, diamond-boron nitride composite compacts, and their combinations.

Other aspects and advantages will be apparent from the following description and the appended claims.

DETAILED DESCRIPTION

Given the expansive nature of the requirements for expandable tubulars, and the deficiencies with the prior art methods of reducing friction noted above, there is a need for low friction coatings with improved properties. Given the operating environments for these applications, which typically include high loads and severe abrasive conditions, traditional and conventional low friction coatings (e.g., graphite, $MoS_2$, $WS_2$) may not meet durability requirements in some cases. Accordingly, one or more embodiments of the present disclosure are directed toward expansion cones including coatings or inserts for reducing the friction between the expansion cone and the expandable tubular.

In one aspect, embodiments of the present disclosure are directed toward an expansion cone including a diamond containing coating to reduce the friction between the expansion cone and the expandable tubular. The diamond containing coating, for example, may be a diamond coating or diamond like coating (DLC). By including the diamond containing coating on the expansion cone, advantages such as increasing hardness of the cone, decreasing coefficient of friction, increasing wear resistance and prolonging the life of the cone may be achieved.

Figure 2A:
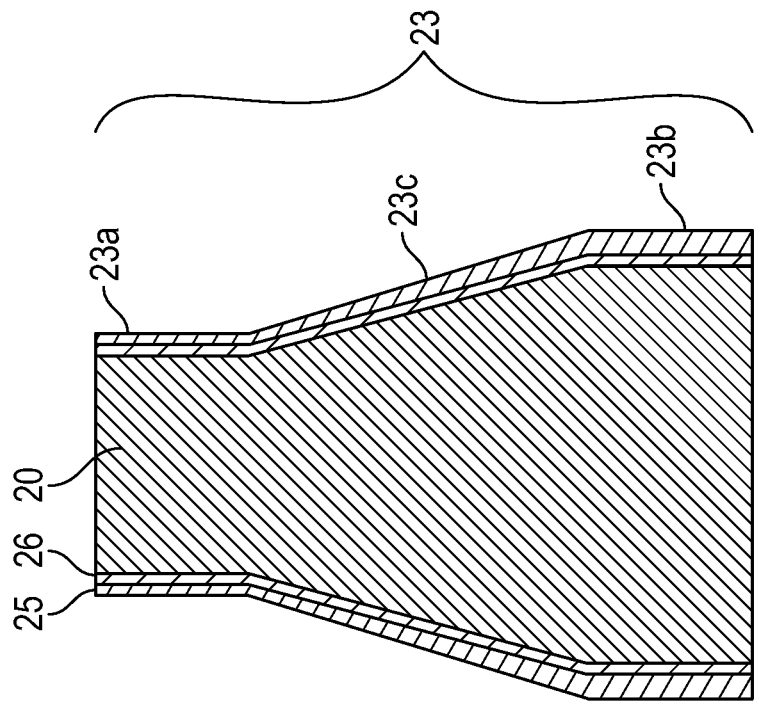
FIGS. 2a-2b are schematic illustrations of an expansion cone according to embodiments herein.

Referring now to FIG. 2a, a schematic illustration of an expansion cone according to embodiments herein is illustrated. As the present disclosure is related to the outer surfaces of the expansion cone, the connections and inner flow path or paths within the expansion cone are not illustrated. The expansion cone 20 may include a base material 23 having an upper cylindrical section 23a, a lower cylindrical section 23b, and a tapered section 23c therebetween. The base material, in some embodiments, may be a steel alloy. In particular embodiments, the steel alloy may be selected from a group consisting of alloyed steel, tungsten carbide coated alloyed steel, and cemented tungsten carbide.

A diamond or diamond-like coating 25 may be disposed on at least a portion of the outer surface of the base material. In some aspects, the diamond coating may be made from nanocrystalline diamond, amorphous diamond, or a mixture thereof. The diamond coatings can be achieved by chemical vapor deposition (CVD) including filament-assisted thermal CVD, electron-assisted thermal CVD, laser-assisted thermal CVD, RF-plasma CVD, microwave-plasma CVD, combustion flame-assisted CVD, direct-current arc plasma jet CVD, among other processes known in the art. In some other aspects, the coating may be made from a diamond-like carbon (DLC). The DLC may be achieved by ion beam deposition, sputter deposition, plasma assisted chemical vapor deposition, electron-excited plasma CVD (EEP-CVD), pulsed cathodic arc deposition, and magnetron sputter ion plating process, among others.

While the coating is illustrated in FIG. 2a as being deposited on the entirety of the outer surface area of the base material cone, embodiments herein contemplate coating only the tapered section 23c, as that is the portion of the cone encountering the greatest amount of friction. Embodiments herein also contemplate coating the tapered section and portions of the upper cylindrical section 23a and lower cylindrical section 23b adjacent to the tapered section 23c, providing low friction areas leading into and out of the high friction zone.

Figure 2B:
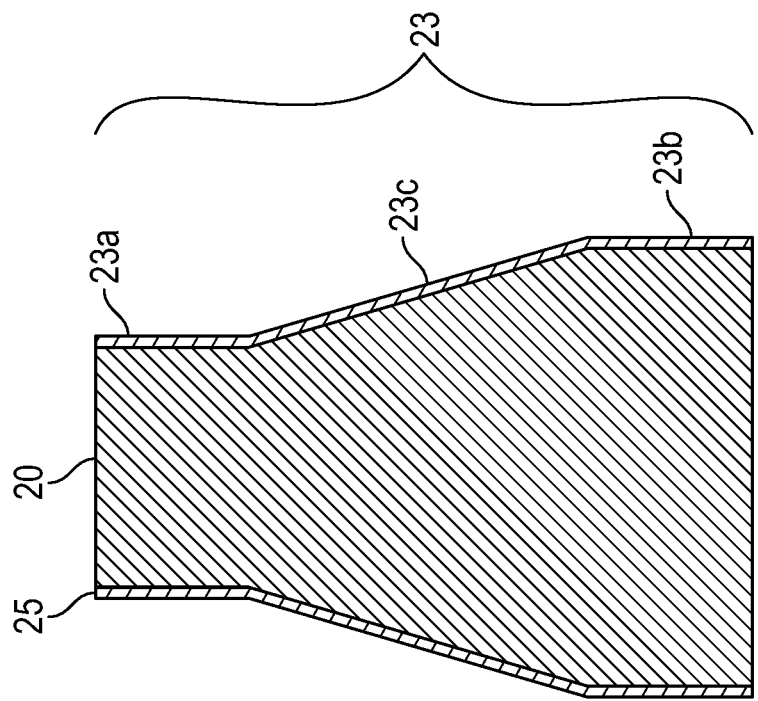

In one or more embodiments, the expansion cone may also include a buffering layer intermediate the base material and the coating to achieve better crystalline bonding between the diamond or diamond-like coating with the base material substrate of the cone. Referring now to FIG. 2b, the expansion cone may include a base material 23 having an upper cylindrical section 23a, a lower cylindrical section 23b, and a tapered section 23c therebetween. The base material, in some embodiments, may be a steel alloy or cemented tungsten carbide. In particular embodiments, the steel alloy may be selected from a group consisting of alloyed steel and tungsten carbide coated alloyed steel.

An intermediate buffering layer 26 may be disposed on at least a portion of the outer surface of the base material. As used herein, "intermediate buffering layer" and "buffering layer" may be used interchangeably. The buffering layer 26 may have, for example, a thickness as thin as 1-5 μm, but may be as thick as 100-300 μm. The buffering layer may be formed from one or more selected from a group consisting of Silicon (Si), Titanium (Ti), and silicon carbide (SiC).

After depositing the buffer layer 26 on the base material 23, or a portion thereof, the diamond coating may be deposited on top of the buffering layer 26. A diamond or diamond-like coating 25 may be disposed on at least a portion of the outer surface of the buffering layer 26. In some aspects, the diamond coating may be made from nanocrystalline diamond, amorphous diamond, or a mixture thereof. In some other aspects, the coating may be made from a diamond-like carbon (DLC). As with the embodiment of FIG. 2a, the buffering layer and diamond or diamond-like coating may be applied to an entirety or a portion of the outer surface of the cone.

In another aspect, embodiments of the present disclosure are directed toward an expansion cone including inserts to reduce the friction between the expansion cone and the expandable tubular. The inserts may be diamond blocks or inserts including diamond or diamond-like coatings. By including such inserts on the expansion cone, advantages such as increasing wear resistance, reducing coefficient of friction and prolonging the life of the cone may be achieved.

Referring now to FIGS. 3a-3f, schematic illustrations of expansion cones including inserts, and the inserts, are shown. Similar to the above embodiments, the expansion cone 50 may include a base material having an upper cylindrical section 23a, a lower cylindrical section 23b, and a tapered section 23c therebetween (see FIGS. 2a-2b). The expansion cone may further include a plurality of inserts 55 disposed within pockets 57 (FIG. 3b) formed in the base material of the cone.

Figure 3C:
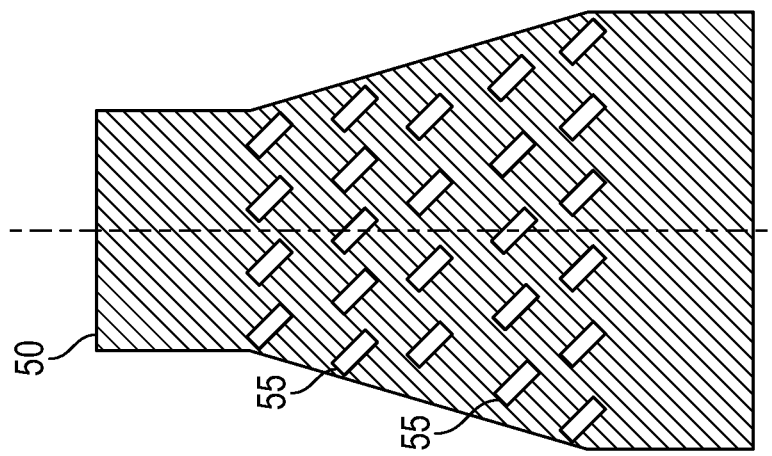
FIGS. 3a-3f are schematic illustrations of an expansion cone according to embodiments herein, FIG. 3b being a cross-sectional view.
Figure 3B:
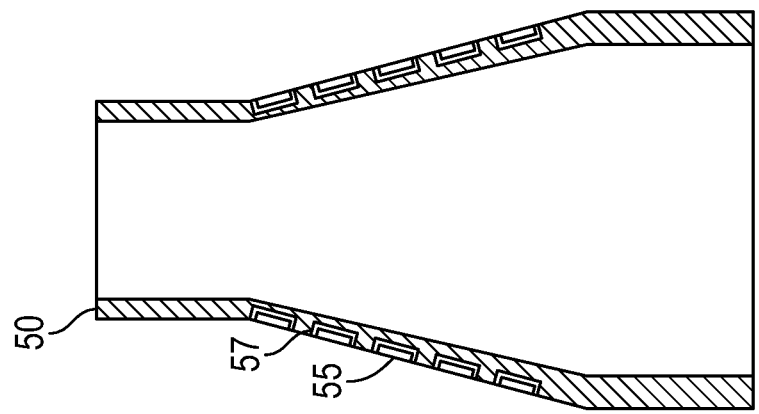
Figure 3A:
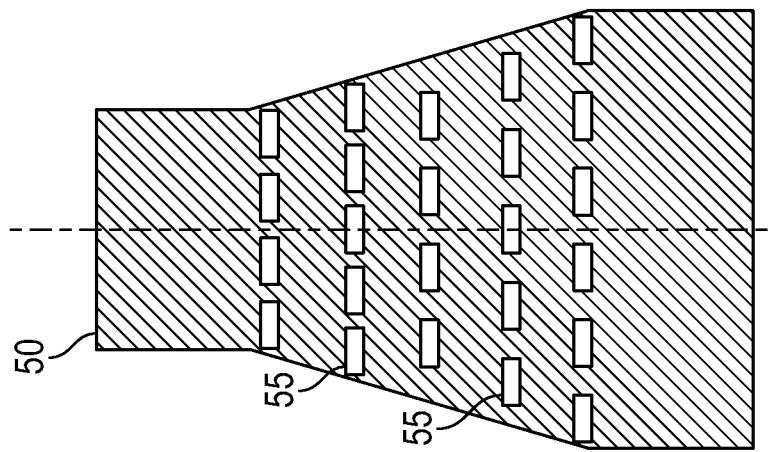
Figure 3D:
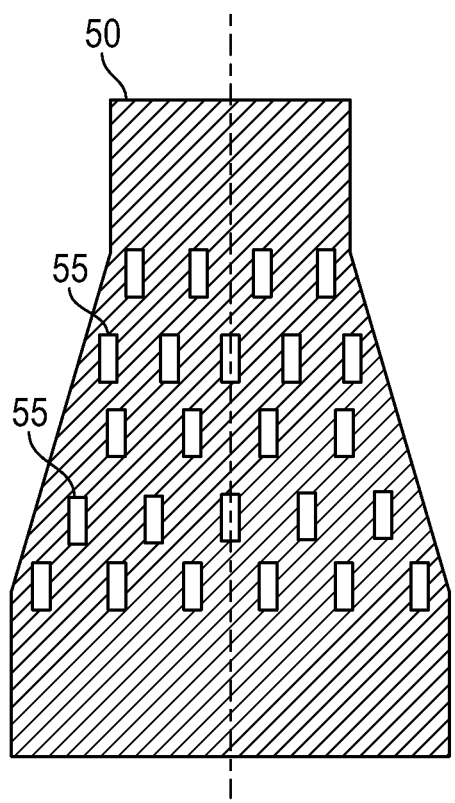

As illustrated in the embodiments of FIGS. 3a, 3c, and 3d, the pockets 57 and inserts 55 may be disposed along a length of the tapered section. Embodiments herein additionally contemplate inserts being disposed along the upper cylindrical section, the lower cylindrical section, combinations thereof, or portions thereof. For example, embodiments herein also contemplate use of inserts in the tapered section and portions of the upper cylindrical section and lower cylindrical section adjacent to the tapered section, providing low friction areas leading into and out of the high friction zone.

The inserts, also referred to herein as diamond blocks, are illustrated in FIGS. 3a-3f as being rectangular. Other shapes may be used for the inserts, including, for example, cylinders, squares, triangles, trapezoids, and other shapes, or combinations thereof, as may be readily envisioned by one skilled in the art. Further, the inserts may be arranged on the expansion cone in any number of manners, such as horizontally parallel (FIG. 3a), vertically parallel (FIG. 3b), or angled (FIG. 3c). Other patterns may be readily envisioned, such as a helical or spiral pattern, among others. In some embodiments, the inserts may be disposed such that vertically there is overlap between the rows, thereby providing at least some friction reduction between the cone and an expandable tubular being worked upon along all vertical paths of the tapered section of the cone. In other embodiments, different shaped inserts may be deposited on different sections of the cone, as may be readily envisioned by one skilled in the art. For example, triangle shapes may be deposited on the upper cylindrical section while rectangular shapes may be deposited on the tapered section. Other combinations are equally contemplated.

The inserts, and their corresponding pockets, may be sized, spaced, and used in an amount such that the physical integrity of the base expansion cone is not compromised. The particular sizing and spacing may depend, for example upon the size and configuration of the expansion cone, among other variables. The pockets and inserts may be further sized and configured such that the inserts may be press fit into, and retained within, the pockets. Alternatively, the inserts may be brazed into the pockets.

Figure 3E:
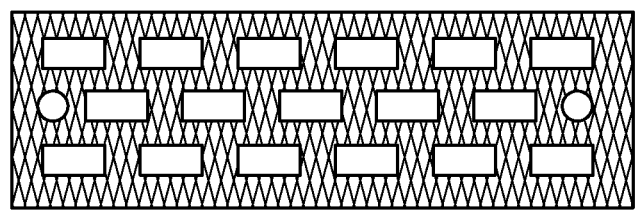
Figure 3F:
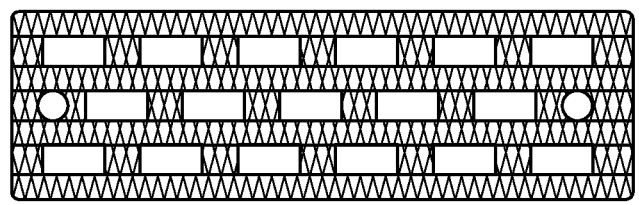

FIGS. 3e and 3f illustrate embodiments of the inserts or diamond blocks. The diamond blocks may be comprised of unleached diamond-cobalt compacts, leached diamond-cobalt compacts, diamond-silicon compacts, binderless diamond compacts, diamond-boron nitride composite compacts, and their combinations. The typical geometry may vary, such as 10×5×5 mm rectangular, OD 10×5 mm disc and others. The diamond blocks may include a base block formed from a material that, in some embodiments, may be a steel alloy or cemented tungsten carbide. In particular embodiments, the steel alloy may be selected from a group consisting of alloyed steel, and tungsten carbide coated alloyed steel.

A diamond or diamond-like coating may be disposed on at least a portion of the outer surface of the base material of the insert block. In some aspects, the diamond coating may be made from nanocrystalline diamond, amorphous diamond, or a mixture thereof. The diamond coatings can be achieved, for example, by chemical vapor deposition (CVD) including filament-assisted thermal CVD, electron-assisted thermal CVD, laser-assisted thermal CVD, RF-plasma CVD, microwave-plasma CVD, combustion flame-assisted CVD, direct-current arc plasma jet CVD, among other processes known in the art. In some other aspects, the coating may be made from a diamond-like carbon (DLC). The DLC may be achieved by ion beam deposition, sputter deposition, plasma assisted chemical vapor deposition, electron-excited plasma CVD (EEP-CVD), pulsed cathodic arc deposition, and magnetron sputter ion plating process, among others.

In some embodiments, a buffering layer may be disposed on at least a portion of the outer surface of the base material. The intermediate buffering layer may have, for example, a thickness as thin as 1-5 μm, but may be as thick as 100-300 μm. The buffering layer may be formed from one or more selected from a group consisting of Silicon (Si), Titanium (Ti), and silicon carbide (SiC).

The diamond coating, and the intermediate buffering layer, as noted above, may be disposed on at least a portion of the outer surface of the block. For example, the diamond coating may be coated only on the face of the block that will be exposed following insertion into the pocket. In some embodiments, the diamond coating may be applied to only a portion of the face of the block that will be exposed following insertion into a pocket. For example, the coating may be formed over a discrete zone or zones, and may be patterned along the surface, such as to form pads or strips of the diamond coating on the surface of the insert block. In one embodiment, the thickness of diamond coating can be in the range of 1-50 microns. In another embodiment, the thickness of diamond coating can be in the range of 5-25 microns. In yet another embodiment, the thickness of diamond coating can be in the range of 10-20 microns.

In another aspect, embodiments of the present disclosure are directed toward an expansion cone including diamond inserts. The inserts may be 1-50 microns above the surface of the cone base material. In another embodiment, inserts may be 5-25 microns above the surface of the cone base material. In yet another embodiment, inserts may be 10-20 microns above the surface of the cone base material.

As described above, embodiments disclosed herein relate to an expansion cone useful for expanding an expandable tubular and for reducing the friction between the expansion cone and the expandable tubular being worked upon. As described, embodiments of the expansion cone may include a steel alloy base material selected from a group consisting of alloyed steel and tungsten carbide coated alloyed steel. Alternatively, embodiments of the expansion cone may include a cemented tungsten carbide. The expansion cone may also include a coating that is deposited on an outer surface of the expansion cone or an insert providing a surface area having a coating exposed proximate an outer surface of the expansion cone. The expansion cone or insert may further include a buffering layer between the base material of the cone or insert and the coating.

The diamond or diamond-like coating may have beneficial properties of high hardness, low coefficient of friction and low galling tendency with steels. The high hardness can provide high wear resistance to prolong the life of the cone. Their coefficients of friction with the other mating metallic materials of the tubular are typically much lower than those of the raw materials without a coating.

In one or more embodiments, the coating may be a diamond coating selected from a group consisting of nanocrystalline diamond, amorphous diamond, and a mixture thereof. Diamond coatings have beneficial properties of high hardness and wear resistance to prolong the life of the cone. The coefficient of friction of diamond coatings herein with the other mating materials are typically lower than those of the raw materials without a coating. Also with the coating on the cone, the galling tendency will be significantly reduced between the cone and the tubular.

In yet other embodiments, the coating may be a diamond-like carbon (DLC). The DLC coating has similar benefits to the diamond coating.

Therefore, by applying the coating and the buffering layer to the substrate of the expansion cone or insert, it is possible to significantly reduce the frictional force and the chance of galling. While the coating may provide reduced friction, in some embodiments, the diamond or diamond-like coating may be configured to flake or partially flake during use, such as when an outer surface of the expansion cone engages an expandable tubular. The flaking of the coating may act as a solid lubricant in some embodiments, providing further lubrication between the tubular and the expansion cone.

Turning now to the FIGS. 4a-4e, schematic illustrations of embodiments of the expansion cone disposed in and working on an expandable tubular system. Starting with FIG. 4a, the expandable tubular 40 being worked upon by the expansion cone 20 includes an unexpanded tubular section 43a, an expanded tubular section 43b and a joint or transition zone 43c undergoing expansion.

The expansion cone 20, which may be as described with FIGS. 2a-2b and 3a-3d, may be made from alloyed steel, tungsten carbide coated alloyed steel, or cemented tungsten carbide material, for example. The expandable tubular 40 may be made from expandable steel, woven steel, nickel-based alloy, aluminum alloy, and a non-metallic composite, for example.

Figure 1:
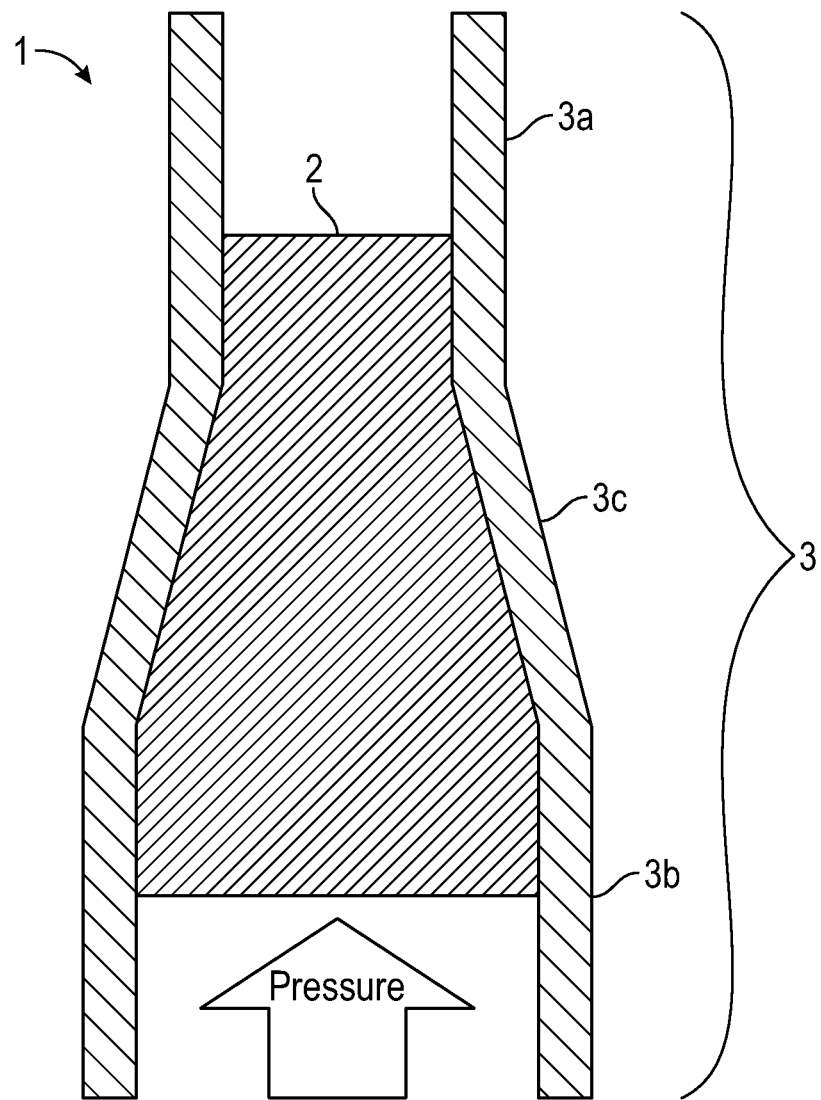
FIG. 1 is a schematic illustration of an expansion cone in an expandable tubular system without coating as used in the prior art.
Figure 4A:
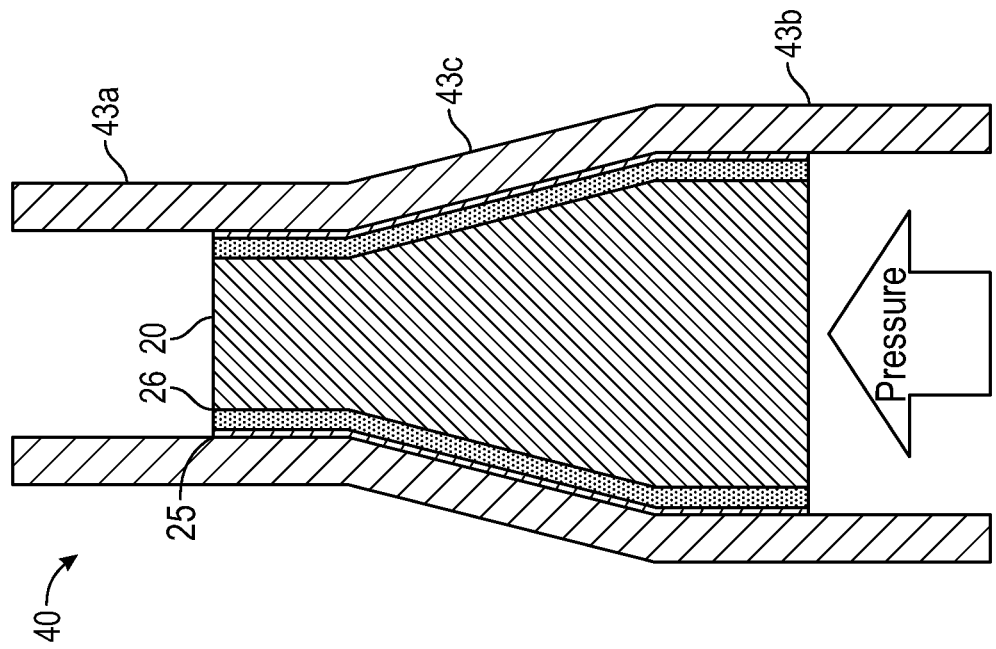
FIGS. 4a-4e are schematic illustrations of an expansion cone in an expandable tubular system according to embodiments disclosed herein.

As described above, the expansion cone 20 may be pushed or pulled through the expandable tubular using hydraulic or mechanical means. As shown in FIG. 1, during a time where a fluid is applying pressure to the expansion cone 20, moving the expansion cone through the expandable pipe, the expansion cone 20 applies a force on the joint section 43c and plastically deforms the tubular resulting in the expansion of unexpanded tubular section 43a to form expanded tubular section 43b. The pressure creates a frictional force between the expansion cone 20 and the expandable tubular 40. When there is no diamond coating between the expansion cone 20 and the expandable tubular 40, the frictional force is directly applied on the area of the joint 43c. Due to the material properties that form the expansion cone 20 and the expandable tubular 40, there is a high coefficient of friction between the surface of the expansion cone 20 and the surface of the expandable tubular 40 causing a high galling tendency. However, as shown in FIG. 4a, the expansion cone 20 having a diamond coating or diamond like coating 25 deposited on an outer surface of the expansion cone 20. The high hardness property of the diamond coating 25 provides a high wear resistance to prolong the life of the expansion cone 20 and reduce the wear on both the expansion cone 20 and the tubular 40 during expansion. Further, because the coefficients of friction between the diamond coating 25 with the other mating metallic materials of the tubular are much lower than those of the raw materials without a coating, the galling tendency between the expansion cone 20 and the tubular is significantly reduced.

Another advantage of applying the diamond or diamond-like coating 25 is that the diamond or diamond-like coating 25 may also act as a dry lubricant. A dry lubricant, despite of being in a solid phase, may reduce friction between the the surface of the expansion cone 20 and the surface of the expandable tubular 40 without the need for a liquid oil medium or other lubricant. Furthermore, even if there may be any flaking of the diamond coating 25, the flaking may not act as detriment foreign material, but may act as additional dry lubricants to facilitate the expansion process.

Figure 4B:
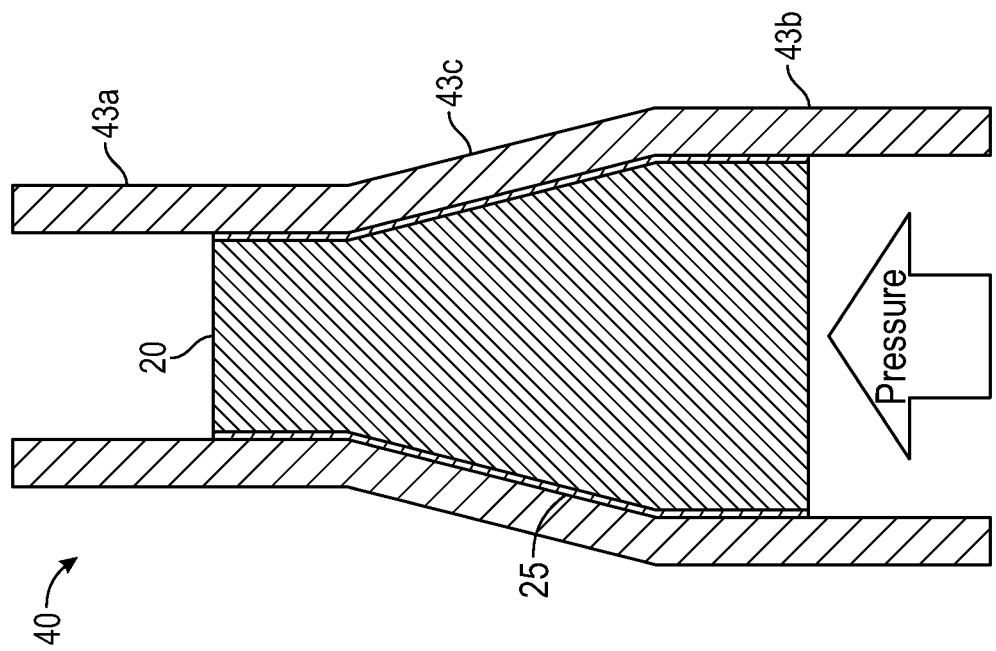
Figure 4D:
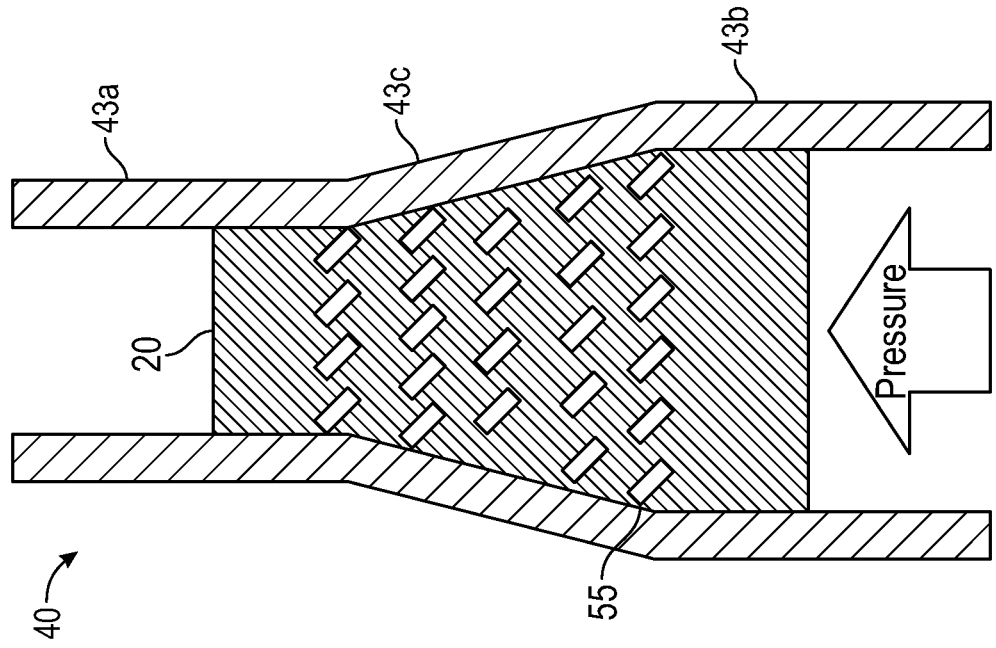
Figure 4C:
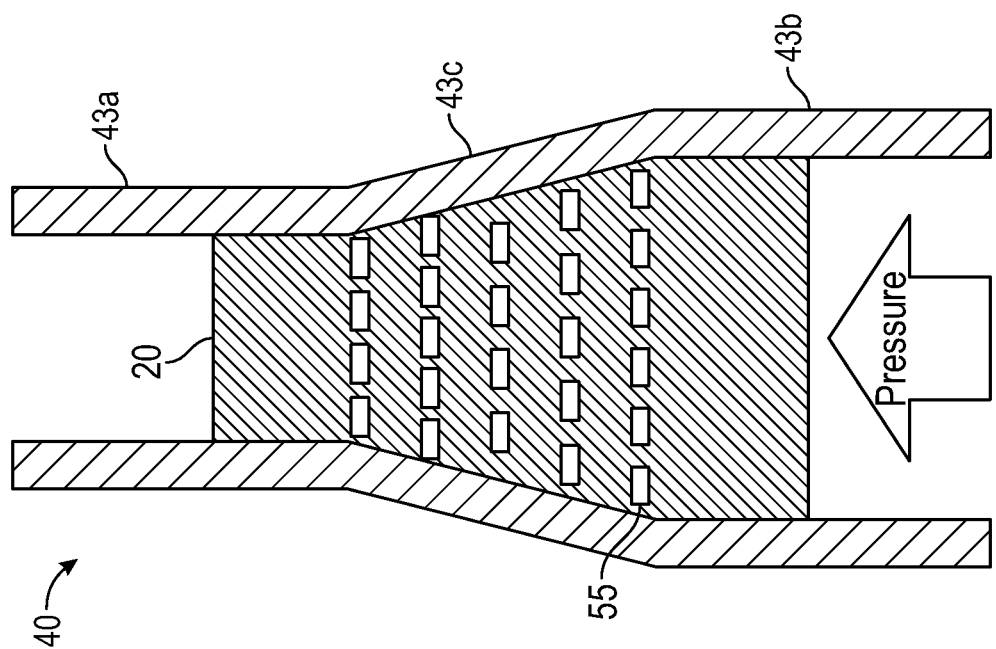
Figure 4E:
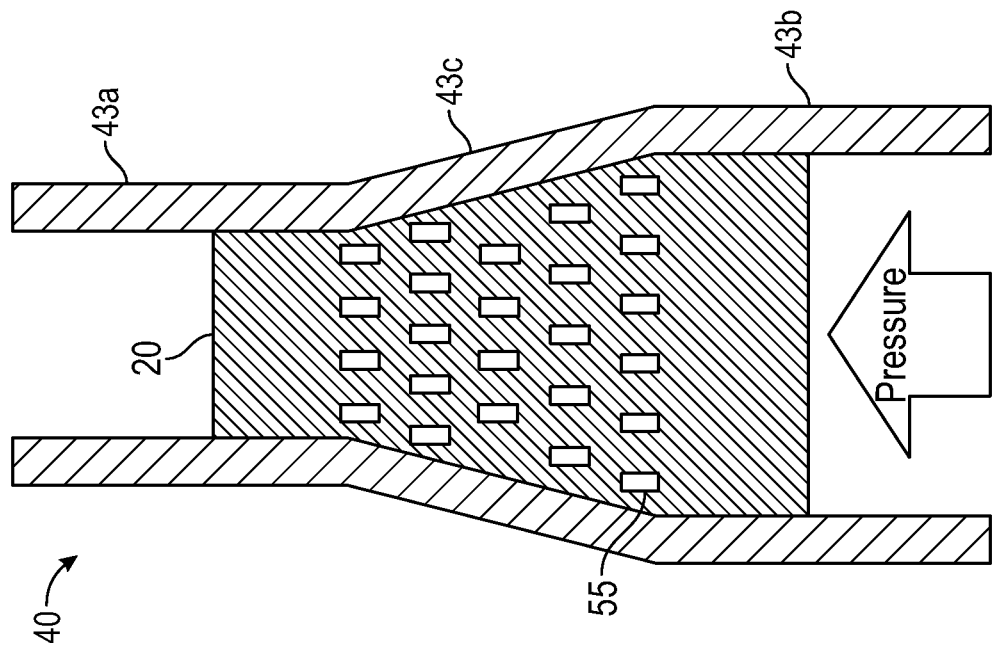

Referring now to FIGS. 4b-4e, FIGS. 4b-4e illustrate similar expansion processes using expansion cones according to other embodiments herein. FIG. 4(b) illustrates the use of the embodiment of the expansion cone 20 of FIG. 2(b), including the intermediate buffering layer 26 between the base cone material and the diamond or diamond-like coating 25. FIGS. 4c-4e illustrate the use of the embodiments of the expansion cone of FIGS. 3a, 3c, and 3d, which include diamond blocks 55 to provide lubricity and galling resistance, among other beneficial properties, along the transition zone 43c during expansion of the tubular 40.

Embodiments herein are also directed toward methods for forming an expansion cone useful for expanding an expandable tubular. In one or more embodiments, a method for forming an expansion cone, such as the expansion cone 20 of FIG. 2b includes forming a base expansion cone, such as from a material selected from a group consisting of alloyed steel, tungsten carbide coated alloyed steel, and cemented tungsten carbide. The base expansion cone may be a solid expansion cone or a collapsible expansion cone, for example. Following formation of the base expansion cone, the method may include depositing a buffering layer 26 on at least a portion of the base expansion cone, and then depositing a diamond or diamond-like coating 25 on the buffering layer previously deposited on the base expansion cone.

In one or more embodiments, the diamond coating 25 may be applied by chemical vapor deposition (CVD). CVD is a vacuum deposition method used to produce thin films, and in some embodiments, the diamond coating 25 may have a thickness in the range of 1 µm to 300 µm, such as a coating thickness in a range having a lower limit of 1 µm, 2 µm, 3 µm, 4 µm, 5 µm, 10 µm, 25 µm or 50 µm to an upper limit of 5 µm, 10 µm, 25 µm, 50 µm, 100 µm, 150 µm, 200 µm, or 300 µm, where any lower limit may be combined with any upper limit. The diamond coating may be made from nanocrystalline diamond, amorphous diamond, or a mixture thereof, and has beneficial properties of high hardness, low coefficient of friction and low galling tendency with steels. The cone is typically placed in a vacuum chamber. The carbon-containing gas precursor is injected into the chamber and dissociated by thermal, plasma or combustion processes in order to promote the diamond nucleation and growth. The typical substrate temperature can be between 500 and 1200° C.

In methods emplacing a diamond-like coating on an outer surface of the expansion cone 20, methods for applying the diamond-like coating may include ion beam deposition (IBD), sputter deposition, plasma assisted chemical vapor deposition (CVD), electron-excited plasma CVD (EEP-CVD), pulsed cathodic arc deposition, and magnetron sputter ion plating process, among others. The DLC coating processed in a vacuum or atmospheric environment by decomposing hydrocarbon gases under the trigger source such as plasma, arc, ion-beam and pressures. The $SP^2$ bond can be mixed with $SP^3$ bond at low temperature at the substrate as low as 200° C. to form the DLC coating. The diamond-like coating may be made from diamond-like carbon, such as tetrahedral amorphous carbon. The properties of the diamond-like coating may depend on the deposition methods and parameters used. The high hardness property of the diamond-like coating provides a high wear resistance to prolong the life of the expansion cone. The coefficients of friction of diamond-like coatings with the other mating metallic materials of the tubular are typically much lower than those of the raw materials without a coating. Also, with the coating on the expansion cone, the galling tendency between the expansion cone and the expandable tubular may be significantly reduced. Another advantage of applying the diamond-like coating is that the diamond-like coating may also act as a dry lubricant, reducing friction between the surface of the expansion cone and the surface of the expandable tubular, as described above. Diamond-like coatings as used herein also prevents wear due to their tribological properties. In particular, the diamond-like coatings as used herein demonstrate enhanced resistance to wear and abrasion, making them suitable for use in applications that experience extreme contact pressure and severe abrasive environments. In one or more embodiments, the diamond-like coating may have a thickness in the range of 1 μm to 300 μm, such as a coating thickness in a range having a lower limit of 1 μm, 2 μm, 3 μm, 4 μm, 5 μm or 10 μm to an upper limit of 5 μm, 10 μm, 25 μm, 50 μm or 100 μm, where any lower limit may be combined with any upper limit.

The buffering layer may be placed between the expansion cone substrate and the diamond or diamond-like coating to achieve better bonding and/or a high hardness zone. The buffering layer in embodiments herein may be made from Silicon (Si), Titanium (Ti), and silicon carbide (SiC), or mixtures thereof. The thin buffering layer may be applied by physical vapor deposition (PVD) or CVD. Both PVD and CVD are vacuum deposition methods used to produce thin films. PVD may be a line-of-sight coating process which allows for thin coatings and sharp edges, while CVD may be usually thicker and better for protection against heat. Either method may be applied when depositing the buffering layer 6 in order to achieve a better crystalline bonding with both the steel substrate and the subsequent diamond coating 5. The PVD process to vaporize the material from a condensed phase to a vapor phase. It is then condensed back to condensed phase on the substrate of the targeting part to form a coating.

In one or more embodiments, the intermediate buffering layer may have a thickness in the range of 1 μm to 300 μm, such as a coating thickness in a range having a lower limit of 1 μm, 2 μm, 3 μm, 4 μm, 5 μm, 10 μm, 25 μm or 50 μm to an upper limit of 5 μm, 10 μm, 25 μm, 50 μm, 100 μm, 150 μm, 200 μm, or 300 μm, where any lower limit may be combined with any upper limit.

In yet another embodiment, the buffering layer may be a WC-based coating. The WC-based coating may be applied on the steel substrate of the expansion cone by thermal spray, for example. The hardness of WC-based thermal spraying coating is typically as high as HV 850-1350 to improve the wear resistance of the expansion cone. The coefficient of friction against the casing can be still as high as 0.45 in dry condition and 0.12 in a water-based drilling mud. In one or more embodiments disclosed herein, an additional thin diamond or diamond-like coating may be deposited on the top of the WC-based coating, allowing the coefficient of friction against the tubular to be significantly reduced without sacrificing the strength and toughness of the cone substrate. In such embodiments, the coefficient of friction may be as low as 0.05.

In one or more embodiments, the buffering layer may include multiple coating layers. For example, the buffering layer may include an additional adhesion layer that may be used for strengthening the overall toughness of the coating and improving compatibility between the base layer and the Si, Ti, or SiC buffering layer or between the Si, Ti, or SiC buffering layer and the diamond or diamond-like coating.

Figure 5:
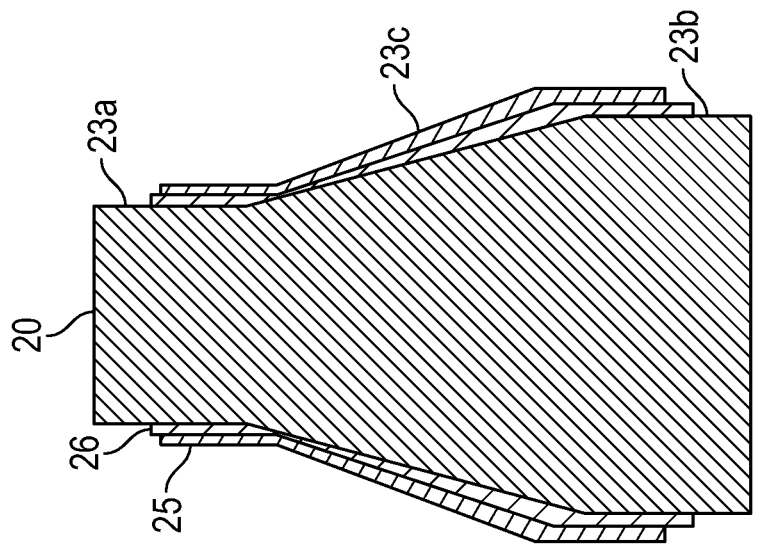
FIG. 5 is a schematic illustration of an expansion cone according to embodiments disclosed herein.

As noted above, the intermediate buffering layer(s) and the diamond or diamond-like coatings may be applied to all or a portion of the outer surface of the expansion cone. For example, the buffering layer and the diamond or diamond-like coating may be disposed only on the outer surface area of the transition zone of the expansion cone. In some embodiments, the buffering layer and the diamond or diamond-like coating may be disposed only on the outer surface area of the transition zone of the expansion cone and one or both of the upper and lower cylindrical sections or a portion of one or both of the upper and lower cylindrical sections. For example, as illustrated in FIG. 5, the intermediate buffering layer 26 and diamond or diamond like coating 25 may extend into a portion of the upper and lower cylindrical sections 23a, 23b, and in some embodiments, the buffering layer 26 may extend further into the cylindrical sections than the coating 25. In embodiments where the layers extend into the upper and/or lower cylindrical sections, the buffering layer 26 and/or diamond coating 25 may cover from as little as 1% to as much as 100% of the outer surface area of the cylindrical section(s), such as from 1%, 5%, 10% or 25% to 15%, 25%, 50%, 75%, or 100% of the surface area, where any lower limit may be combined with any upper limit.

Table 1 is a comparison of the coefficient of friction and galling tendency among different materials (alloyed steel, tungsten carbide, diamond coating, and DLC) measured in dry condition. As shown in Table 1, the expansion cone with diamond coating and with DLC have significantly less coefficient of friction than the alloyed steel expansion cone or an expansion cone with an outer tungsten carbide layer. Furthermore, the galling tendency of the expansion cone with a diamond coating and with DLC are also very low.

TABLE 1

Coefficient of friction and galling tendency of various materials (in dry condition)

| Cone Tubular | Alloyed Steel | | Tungsten Carbide | | Diamond Coating | | DLC | |
|---|---|---|---|---|---|---|---|---|
| | Carbon steel | Stainless steel | Carbon steel | Stainless steel | Carbon steel | Stainless steel | Carbon steel | Stainless steel |
| Coefficient of Friction (kinetic) | 0.4 | 0.4 | 0.45 | 0.45 | 0.05-0.13 | 0.01-0.30 | <0.02 | 0.16 |
| Galling Tendency | Low | High | Low | Low | Very low | Very low | Very low | Very low |

Other embodiments herein are directed toward a method of forming an expansion cone useful for expanding an expandable tubular, where the expansion cone included diamond blocks, such as illustrated in FIGS. 3a-3f. The method may include forming a base expansion cone having an upper cylindrical section, a lower cylindrical section, and a tapered section therebetween. Pockets may be formed within the base expansion cone. The pockets, in some embodiments, may be formed in only the tapered section. In other embodiments, the pockets may be formed in the tapered section and one or both of the upper and lower cylindrical sections or portions thereof. When only formed in a portion of the cylindrical sections, the pockets may be formed in an area adjacent to the tapered section and may encompass a similar portion or area as described above in relation to the coatings and buffering layers.

Following formation of the base expansion cone having pockets formed therein, the method may include disposing an insert within each pocket. The inserts may include a diamond block, or may be an insert block having an outer surface layer or coating selected from a group consisting of nanocrystalline diamond, amorphous diamond, a diamond-like carbon, or mixtures thereof.

Methods for forming the expansion cones having inserts may also include steps for forming the insert. For example, forming an insert may include steps such as forming a base insert block from a material selected from a group consisting of alloyed steel, tungsten carbide coated alloyed steel, and cemented tungsten carbide. Forming the insert may also include depositing a buffering layer on at least a portion of the base insert block and depositing the outer surface layer or coating on the buffering layer. The buffering layer and the coating may be formed using processes as noted above and may have similar thicknesses and properties.

The high hardness property of plurality of diamond blocks 55 provides a high wear resistance to prolong the life of the expansion cone or reduce wear on the tubular. Their coefficients of friction with the other mating metallic materials of the tubular are typically much lower than those of the raw materials without a coating, and may be as low as noted above in Table 1. Also, with the coating on the diamond blocks, the galling tendency may be significantly reduced between the expansion cone and the tubular.

Another advantage of applying the plurality of diamond blocks is that the plurality of diamond blocks may also act as a dry lubricant. The coating on the plurality of diamond blocks may act as dry lubricants, despite of being in a solid phase, and may reduce friction between the surface of the expansion cone and the surface of the expandable tubular without the need for a liquid oil medium. Furthermore, even if there were any flaking of the plurality of diamond blocks, the flaking may not act as detriment foreign material but may act as dry lubricants to facilitate the expansion process.

As illustrated in FIGS. 3a-3f, the pockets may be arranged along the expansion cone in any number of configurations. The plurality of diamond blocks may be disposed within the pockets by press fitting. Alternatively, the blocks may be brazed into the pockets. The diamond blocks may be comprised of unleached diamond-cobalt compacts, leached diamond-cobalt compacts, diamond-silicon compacts, binderless diamond compacts, diamond-boron nitride composite compacts, and their combinations. The typical geometry may vary, such as 10×5×5 mm rectangular, OD 10×5 mm disc and others.

While the present disclosure has been described in conjunction with specific, exemplary embodiments thereof, it is evident that many alterations, modifications, and variations will be apparent to those skilled in the art in light of the foregoing description without departing from the spirit or scope of the present disclosure. Accordingly, the present disclosure is intended to embrace all such alterations, modifications, and variations of the above detailed description.

When numerical lower limits and numerical upper limits are listed herein, ranges from any lower limit to any upper limit, including intermediate points therebetween, are contemplated.

What is claimed is:

1. An expansion cone useful for expanding an expandable tubular, the expansion cone comprising:
   a steel alloy base material having an upper cylindrical section, a lower cylindrical section, and a tapered section therebetween;
   a plurality of pockets formed in at least the tapered section of the steel alloy base material;
   a plurality of inserts disposed within the plurality of pockets, wherein the plurality of inserts comprise an outer surface layer or coating selected from a group consisting of nanocrystalline diamond, amorphous diamond, a diamond-like carbon, and mixtures thereof;
   wherein an upper surface of each of the plurality of inserts is 1-50 microns above an outer surface of the steel alloy base material.

2. The expansion cone according to claim 1, wherein the inserts further comprise:
   an insert base material selected from a group consisting of alloyed steel, tungsten carbide coated alloyed steel, and cemented tungsten carbide; and
   a buffering layer that deposited between the outer surface layer or coating and the insert base material, wherein the buffering layer is selected from a group consisting of Silicon (Si), Titanium (Ti), and silicon carbide (SiC).

3. The expansion cone according to claim 1, wherein the plurality of inserts are selected from a group consisting of unleached diamond-cobalt compacts, leached diamond-cobalt compacts, diamond-silicon compacts, binderless diamond compacts, diamond-boron nitride composite compacts.

4. A method for forming an expansion cone useful for expanding an expandable tubular, the method comprising:
   forming a base expansion cone having an upper cylindrical section, a lower cylindrical section, and a tapered section therebetween;
   forming a plurality of pockets within the base expansion cone tapered section;
   disposing a plurality of inserts within the plurality of pockets, wherein the plurality of inserts are selected from a group consisting of unleached diamond-cobalt compacts, leached diamond-cobalt compacts, diamond-silicon compacts, binderless diamond compacts, diamond-boron nitride composite compacts, and their combinations;
   wherein an upper surface of each of the plurality of inserts is 1-50 microns above an outer surface of an insert base material.

5. The method of claim 4, further comprising forming the plurality of inserts, forming the plurality of inserts comprising:
   forming the insert base material from a material selected from a group consisting of alloyed steel, tungsten carbide coated alloyed steel, and cemented tungsten carbide;
   depositing a buffering layer on at least a portion of the base insert block; and
   depositing the outer surface layer or coating on the buffering layer.

6. The method of claim 5, wherein the buffering layer is formed from a material selected from another group consisting of Silicon (Si), Titanium (Ti), and silicon carbide (SiC).

7. The method according to claim 5, wherein the plurality of inserts are disposed within each of the plurality of pockets by press fitting.

8. The method according to claim 5, wherein the plurality of inserts are disposed within each of the plurality of pockets by brazing.

\* \* \* \* \*